United States Patent
Vollrath et al.

(10) Patent No.: US 6,365,947 B1
(45) Date of Patent: Apr. 2, 2002

(54) SEMICONDUCTOR DEVICE AND METHOD OF INCREASING CHANNEL LENGTH TO ELIMINATE SHORT CHANNEL EFFECTS OF CORNER DEVICES

(75) Inventors: Joerg Vollrath, Richmond; Arthur F. O'Donnell, Mechanicsville, both of VA (US)

(73) Assignees: White Oak Semiconductor Partnership, Sandston, VA (US); Infineon Technologies North America Corp., Cupertino, CA (US)

( * ) Notice: Subject to any disclaimer, the term of this patent is extended or adjusted under 35 U.S.C. 154(b) by 0 days.

(21) Appl. No.: 09/559,776

(22) Filed: Apr. 27, 2000

(51) Int. Cl.$^7$ .................. H01L 29/76; H01L 29/94; H01L 31/062; H01L 31/113; H01L 31/119
(52) U.S. Cl. .................. 257/401; 257/288
(58) Field of Search .................. 257/288, 301, 257/303, 306, 334, 335, 336, 401, 510, 296, 292

(56) References Cited

U.S. PATENT DOCUMENTS

| | | | |
|---|---|---|---|
| 5,966,600 A | 10/1999 | Hong | 438/253 |
| 5,982,008 A * | 11/1999 | Kajiyama | 257/401 |
| 6,017,810 A | 1/2000 | Furukawa et al. | 438/592 |
| 6,054,355 A * | 4/2000 | Inumiya et al. | 438/296 |
| 6,175,140 B1 * | 1/2001 | Kajiyama | 257/401 |

OTHER PUBLICATIONS

Pierret, vol. IV Field Effect Devices, Second Edition, Addison–Wesley Publishing Company, Reading, Massachusetts, pp. 1–7, 29–37 and 127–134, 1990.

* cited by examiner

Primary Examiner—David Nelms
Assistant Examiner—David Nhu
(74) Attorney, Agent, or Firm—Akin, Gump, Strauss, Hauer & Feld, L.L.P.

(57) ABSTRACT

A method of increasing the channel length for small semiconductor devices having decreased gate dimensions, thus reducing or eliminating short channel effects for corner devices. The method generally includes forming a gate electrode and defining first and second active areas both adjacent to the gate electrode, which in turn creates a first corner and a second corner. The geometrical shape and position of the first and second active areas with respect to the gate electrode increase the channel length to be longer the gate electrode length. For example, the first corner is positioned offset with respect to the second corner relative to the gate electrode and the carrier channel is a linear segment connecting the first corner to the second corner. In another embodiment, the carrier channel includes multiple segments. The increased channel length reduces or eliminates short channeling effects without affecting the threshold voltage.

11 Claims, 5 Drawing Sheets

SEMICONDUCTOR DEVICE AND METHOD OF INCREASING CHANNEL LENGTH TO ELIMINATE SHORT CHANNEL EFFECTS OF CORNER DEVICES

FIELD OF THE INVENTION

The present invention relates generally to the field of semiconductor devices; and, more particularly, to a method of maintaining or increasing the channel length while reducing small device dimensions to eliminate short channel effects of corner devices.

BACKGROUND OF THE INVENTION

An integrated circuit (IC) is an assembly of discrete devices such as resistors, transistors, capacitors, etc. The transistor is a device comprising on-off properties that act as a power switch to the IC. A commonly known transistor to those skilled in the art is a field effect transistor (FET), or more particularly, a metal-oxide-semiconductor field effect transistor (MOSFET).

Generally speaking, a typical FET comprises a silicon substrate with a thin layer of thermally grown oxide used to isolate the substrate from a gate electrode. The thin layer of oxide is referred hereafter as gate oxide. The gate electrode controls the on-off properties of the working device. The material of the gate electrode is typically polycrystalline silicon capped with a metal layer such as a silicide. A low resistance of the gate electrode is critical to enhance a current flow of the carriers between two regions adjacent to the gate electrode called the "source" and "drain". The source and drain are regions that have been implanted with impurities, also referred to as dopants. Depending on the type of device structure, boron or phosphorous are commonly used as the dopants. For example, if the device is a P-MOS transistor, the source and drain are doped P+ with boron.

A threshold voltage is applied to the gate electrode and charges the gate electrode to be either negative or positive. In the case the gate electrode is positively charged, the negatively charged electrons in the gate oxide are attracted to the interface of the gate electrode and the gate oxide. Accordingly, the positively charged atoms in the gate oxide are repelled to the interface of the gate oxide and the wafer substrate. Further, in the case where the silicon substrate is doped with N-well, the negative charges in the wafer substrate are attracted to the surface of the substrate. These negative charges create a channel for a current of the carriers to flow between the source to the drain. The channel length (L) is often dictated by the length of the gate electrode.

To achieve higher operating speeds and increased packing densities, the FET device structures continue to shrink below the quarter micron size. The decrease in device dimensions leads to reduced channel lengths, which results in major modifications in the observed device characteristics. The short-channel effects, for example, include shifts in the threshold voltage and an increase in the subthreshold current. The shift in the threshold voltage results in a pinch in the carrier channel described previously so that the flow is cut short before reaching the drain. The shift in the subthreshold current affects the off-state power dissipation, dynamic logic clock speeds, and memory refresh times. The threshold voltage becomes a function of the gate dimensions which often dictates the channel length in smaller devices. In a short channel device, the source and drain assist in depleting the region under the gate. As a result, less gate charge is required. For devices with long channel lengths, the threshold voltage is typically independent of the gate length and width.

To resolve the short channel effect, some methods have been used to implant the wafer substrate with dopants to provide more holes or electrons. For example, in a P-MOS transistor, the wafer substrate was slightly doped with P+ dopants, such as boron or phosphorous. As a result, the P+ dopants provided more electrons to the carrier channel. Due to the added electrons, the shift in the threshold voltage observed in a short channel effect was adjusted to be comparable with the threshold voltage commonly used in devices with large dimensions.

Determining the amount of dopants required for adjusting the threshold voltage is simply a trial and error method. This method requires many test wafers and resources to analyze and evaluate test results. Further, the electrons are typically concentrated at the corners, therefore, the corners of the transistor have a lower threshold voltage than the main transistor where the carrier current flows. The lower threshold voltage at the corners is still observed after readjusting the threshold voltage by doping impurities.

Other solutions to resolve the short channeling effect involved a different etch process to modulate the profile of the active area. Generally, the profile of the active area edge was very steep. Attempts to make the profile more sloped required a great number of test wafers and cross section results. It is desired to fabricate semiconductor devices using reliable, cost-efficient methods to increase the semiconductor device speed and to maintain or enhance the IC performance, as the device structures continue to scale down below the quarter micron size.

BRIEF DESCRIPTION OF THE DRAWINGS

A better understanding of the present invention can be obtained when the following detailed description of an exemplary embodiment is considered in conjunction with the following drawings, in which.

DETAILED DESCRIPTION OF THE INVENTION

Figure 1:
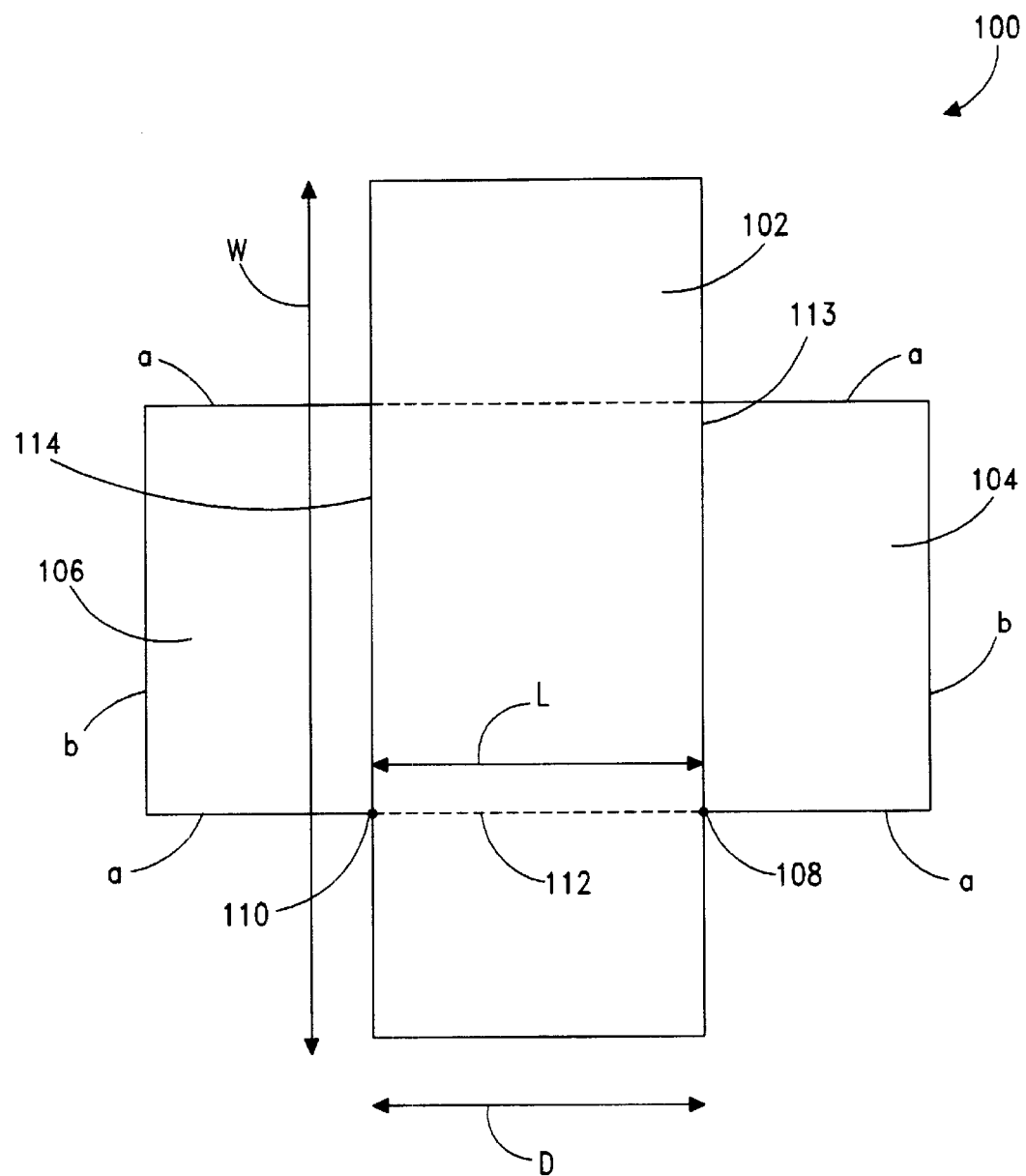
FIG. 1 is a top-down view of an embodiment illustrating a semiconductor device commonly known to those skilled in the art.

For large semiconductor devices with long channel lengths, the threshold voltage is typically independent of the length and width gate dimensions. However, as the semiconductor device dimensions continue to shrink to below the quarter micron size, the threshold voltage becomes a function of the gate dimensions. In other words, as the channel length decreases, the threshold voltage decreases. The present invention provides a method of maintaining or even increasing the channel length while maintaining the gate dimensions to that required for the small devices.

Semiconductor devices are typically manufactured using silicon semiconductor wafers or substrates or the like. A single wafer generally comprises a circular disk with a matrix of semiconductor devices implemented across at least one surface of the disk. The semiconductor devices are fabricated by repetitively patterning the semiconductor wafer or wafer substrate with a patterned mask where each pattern defines a single semiconductor device. Wafer size may vary, although the industry has standardized on particular discrete diameters, such as two hundred (200) millimeters (mm) and, more recently, three hundred (300) mm.

According to the present invention, a method of forming a semiconductor device with increased carrier channel length generally includes forming a gate electrode with two (first and second) sides separated by a gate electrode length of the semiconductor wafer or substrate. The method also includes forming a first active area that is adjacent to the first side of the gate electrode, having at least one first corner, and forming a second active area that is adjacent to the second side of the gate electrode, having at least one second corner. The first and second corners define ending points of a carrier channel having a carrier channel length that is longer than the gate electrode length and allows a carrier current to flow from the first corner to the second corner. The geometrical shapes and position of the first and second active areas with respect to the first and second sides of the gate electrode allow the carrier channel length to be longer than the gate electrode length. The increased carrier channel length, in turn, eliminates short channeling effects without affecting the overall threshold voltage of a device.

An exemplary method of further defining the first and second active areas include a semiconductor wafer or substrate that is patterned with a mask comprising multiple block figures each having geometrical shapes with at least a pair of two adjacent sides forming an angle with respect to one another. For example, the block figures may have parallelogram shapes each having adjacent sides that meet to form an angle offset from perpendicular to one another. The form or shape for each of the block figures in the mask is important in determining the geometrical shape of the first and second active areas for a single semiconductor device. In one embodiment, isolation areas are created in the exposed regions of the mask to prevent cross talking between devices or between the active areas.

Various methods of creating the isolation areas may be used. In one embodiment, the isolation areas are created by first etching the exposed regions in the substrate and forming a trench. The trench is then filled with a nonconductive material, such as silicon dioxide, and then polished for planarization. In this case, the unetched areas of the substrate that were protected by the mask, define the regions for the active areas for a multiple number of semiconductor devices. The mask comprising multiple block figures is removed and the substrate is patterned once again with a mask to define the channel stop regions. The exposed areas of the substrate are implanted with impurities selected depending upon the semiconductor device. By way of example, to create a P-doped metal-oxide-semiconductor (P-MOS) transistor, the substrate is implanted with dopants such as boron. The exposed areas receiving the implant dopants or impurities are the first and second active areas. The active areas may be a source, drain, or a source and drain.

The gate electrode is formed on the substrate in the gate electrode region that was protected from the dopants during the implant. In one embodiment, the gate electrode is polycrystalline silicon, which is commonly known to those skilled in the art. As noted previously, the gate electrode has at least two (first and second) sides separated by a gate electrode length. By way of example, the gate electrode may be rectangular shaped where the first and second sides are substantially parallel with respect to each other and are distanced by the gate electrode length. The first side is adjacent to the first active area, defining at least one first corner and the second side is adjacent to the second active area defining at least one second corner. A carrier channel is further defined beneath the gate electrode and between the first corner and the second corner. In one embodiment, the carrier channel may be a linear segment. In another embodiment, the carrier channel may comprise a plurality of segments connecting from the first corner to the second corner. The geometrical shapes and placement of the active areas with respect to the first and second sides of the gate electrode, also dictates the carrier channel length.

FIG. 1 is a top-down view of an embodiment illustrating a semiconductor device 100 that is commonly known to those skilled in the art. The semiconductor device 100 includes a gate electrode 102 and two (first and second) active areas 104 and 106. The dimensions of the gate electrode 102 include at least one side having a length labeled as 'D' and at least two (first and second) sides 113 and 114 each having a width labeled as 'W' and are parallel to one another. The gate electrode length 'D' is typically below a quarter micron. The first active area 104 lies within the substrate and adjacent to the first side 113 of the gate electrode 102, defining at least one first corner 108. Accordingly, the second active area 106 lies within the substrate and adjacent to the second side 114 of the gate electrode 102, defining at least one second corner 110. The first and second active areas 104 and 106 comprise rectangular shapes of equivalent surface areas having adjacent sides 'a' and 'b' and where the adjacent sides 'a' and 'b' connect to form angles of approximately 90 degrees. The active areas 104 and 106 may be source, drain, or a source and drain.

A carrier channel 112 having a length labeled as 'L', is formed underlying the gate electrode 102 and between the first corner 108 and the second corner 110. This embodiment illustrates the general practice of using a semiconductor device where the channel length labeled as 'L' is equivalent to the gate electrode length 'D'. As the gate electrode length 'D' decreases with shrinking device geometry, the channel length concomitantly shrinks so that the short-channeling effect becomes apparent.

Figure 2:
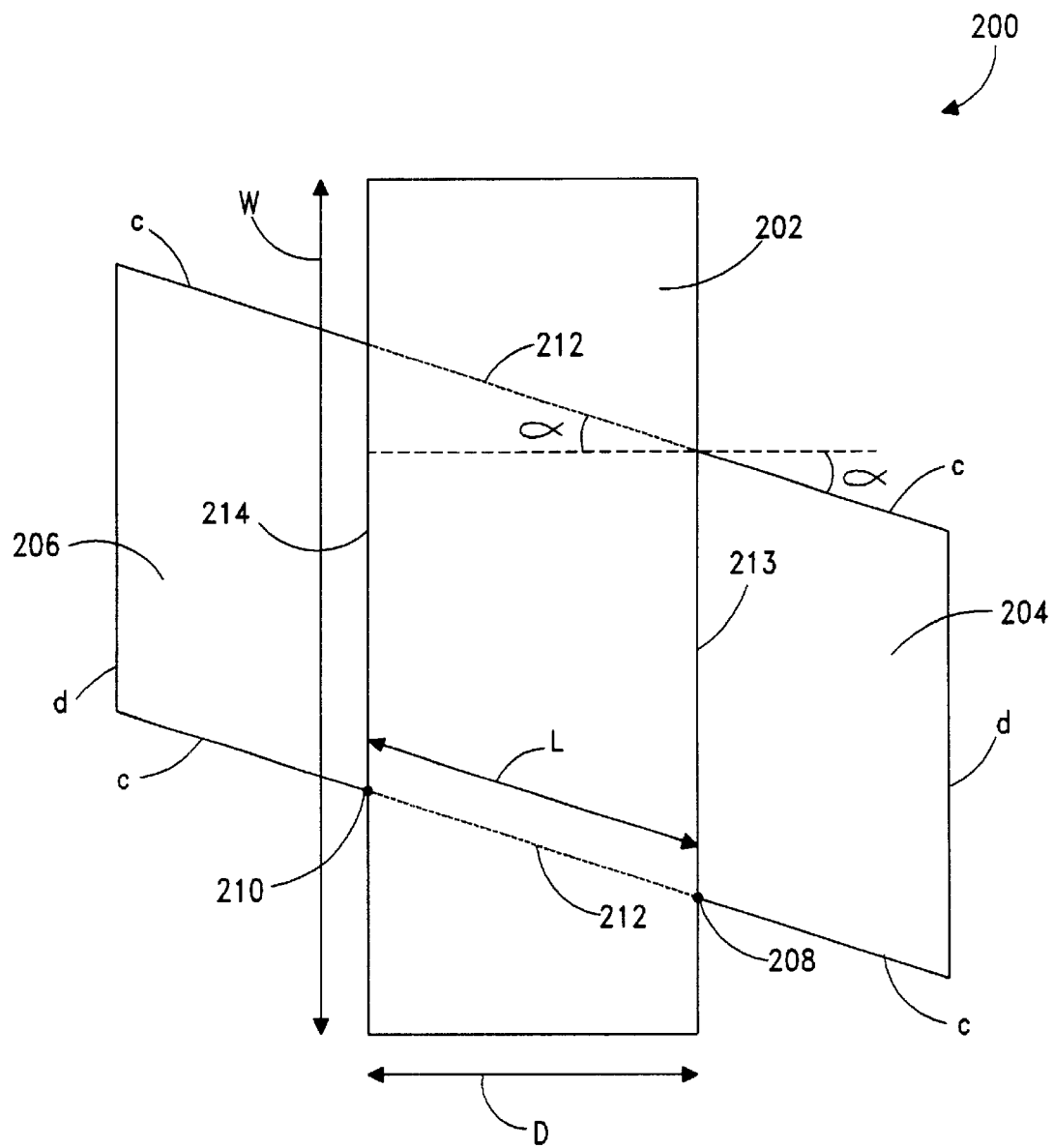
FIGS. 2–5 are top-down views of exemplary semiconductor devices having channel lengths greater than the gate lengths according to various embodiments of the invention.

FIG. 2 is a top-down view of a semiconductor device 200 illustrating an exemplary embodiment of the present invention. The semiconductor device 200, for example, may be a transistor that includes a gate electrode 202 and two (first and second) active areas 204 and 206. The gate electrode 202 includes a first side 213 that is substantially parallel to a second side 214, each having a width labeled as 'W' and separated by a gate electrode length labeled as 'D'. The first active area 204 lies within the substrate and adjacent to the first side 213 of the gate electrode 202, defining at least one first corner 208. Accordingly, the second active area 206 lies within the substrate and adjacent to the second side 214 of the gate electrode 202, defining at least one second corner 210. The first and second corners 208 and 210 each define ending points of a carrier channel 212. In one embodiment, the first corner 208 is positioned offset from orthogonal with respect to the second corner 210 relative to the gate electrode length 'D'. For this particular case, the carrier channel 212 may have a linear segment that is placed at a diagonal with respect to the gate electrode length 'D' and connecting from the first corner 208 to the second corner 210. In another embodiment, the carrier channel 212 may have a plurality of segments connecting from the first corner 208 to the second corner 210.

By way of example, the first and second active areas 204 and 206 may comprise geometrical shapes having sides that create angles offset from perpendicular with respect to the first and second sides 213 and 214 of the gate electrode 202. In particular, the first and second active areas 204 and 206 comprise parallelogram shapes of equivalent surface areas having adjacent sides 'c' and 'd' and where the adjacent sides 'c' and 'd' connect to form angles offset from 90 degrees. The parallelogram shaped active areas 204 and 206 are further positioned at an angle offset from orthogonal with respect to the first and second sides 213 and 214 of the gate electrode 202 as indicated by the angle denoted α. The carrier channel 212 having a length 'L' allows a carrier current to flow from the first corner 208 to the second corner 210. For this particular embodiment, the carrier channel 212 is a linear segment placed at a diagonal with respect to said gate electrode length 'D'. In general, cos α=D/L which is less than one (1) as long as α is greater than zero and less than 90 degrees. Thus, 'D' is less than 'L'. The increased length of the carrier channel 212 eliminates short channel effects without affecting the threshold voltage of a device and while maintaining or reducing small device dimensions.

Figure 3:
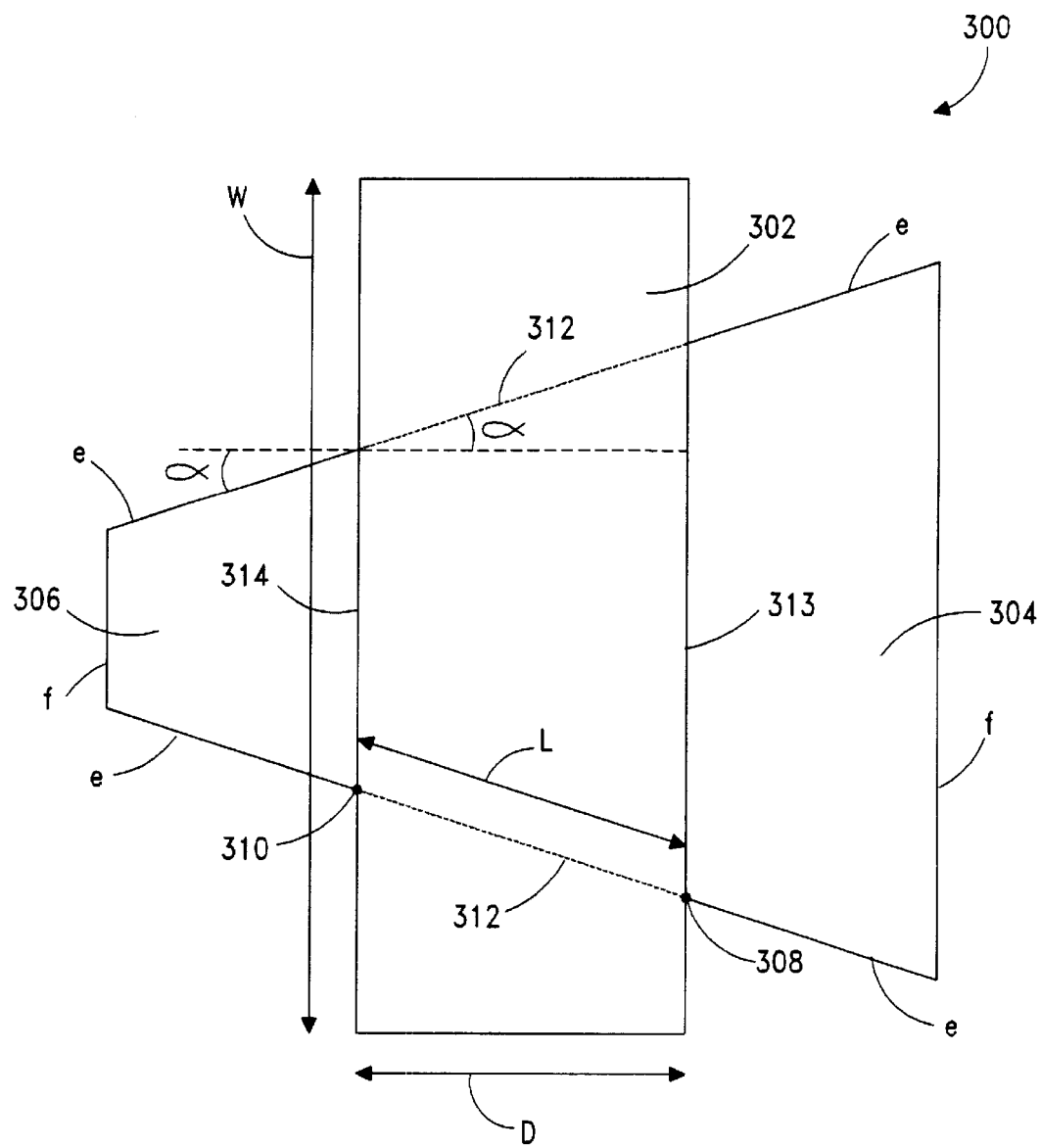

FIG. 3 is a top-down view of a semiconductor device 300 illustrating an exemplary embodiment of the present invention. The semiconductor device 300 includes a gate electrode 302 and two (first and second) active areas 304 and 306. The dimensions of the gate electrode 302 includes a first side 313 substantially parallel to a second side 314 each having a width labeled as 'W' and separated by a gate electrode length labeled as 'D'. The first active area 304 lies within the substrate and adjacent to the first side 313 of the gate electrode 302, defining at least one first corner 308. Accordingly, the second active area 306 lies within the substrate and adjacent to the second side 314 of the gate electrode 302, defining at least one second corner 310.

In one embodiment, the first and second active areas 304 and 306 are further positioned at an angle offset from perpendicular with respect to the first and second sides 313 and 314 of the gate electrode 302. In turn, the first corner 308 is positioned offset from orthogonal with respect to the second corner 310 relative to the gate electrode length 'D'.

By way of example, the first and second active areas 304 and 306 comprise trapezoid shapes of differing surface areas having adjacent sides 'e' and 'f' and where the adjacent sides 'e' and 'f' connect to form angles offset from 90 degrees. The trapezoid shaped active areas 304 and 306 are further positioned at an angle offset from orthogonal with respect to the first and second sides 313 and 314 of the gate electrode 302 as indicated by the angle denoted α. A carrier channel 312 having a length 'L' allows a carrier current to flow from the first corner 308 to the second corner 310. For this particular embodiment, the carrier channel 312 is a linear segment placed at a diagonal with respect to said gate electrode length 'D'. In general, cos α=D/L which is less than one (1) as long as α is greater than zero and less than 90 degrees. Thus, 'D' is less than 'L'. The increased length of the carrier channel 312 eliminates short channel effects without affecting the threshold voltage of a device and while maintaining or reducing small device dimensions.

Figure 4:
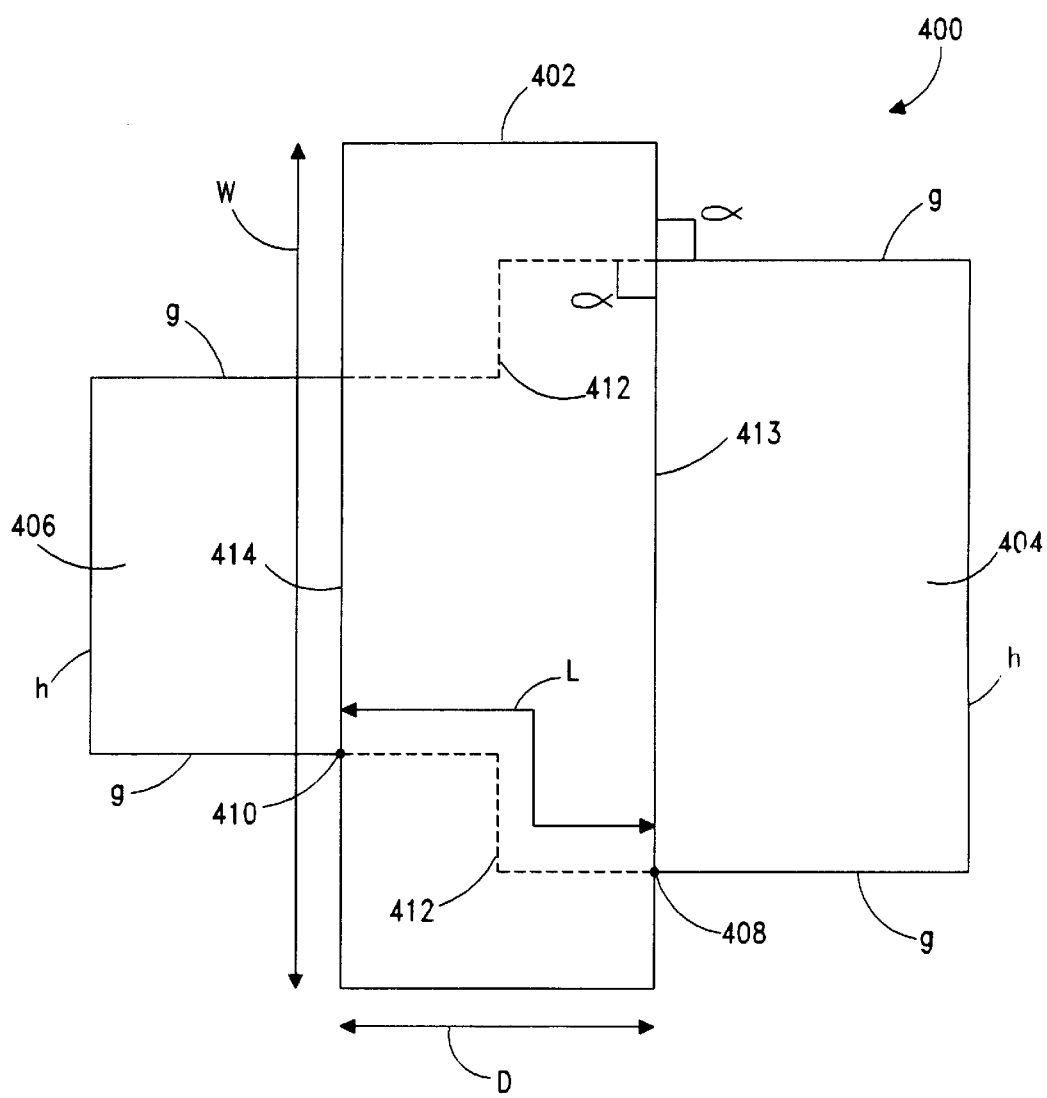

FIG. 4 is a top-down view of a semiconductor device 400 illustrating an exemplary embodiment of the present invention. The semiconductor device 400 includes a gate electrode 402 and two (first and second) active areas 404 and 406. The dimensions of the gate electrode 402 include a first side 413 substantially parallel to a second side 414, each having a width labeled as 'W' and separated by a gate electrode length 'D'. The first active area 404 lies within the substrate and adjacent to the first side 413 of the gate electrode 402, defining at least one first corner 408. Accordingly, the second active area 406 lies within the substrate and adjacent to the second side 414 of the gate electrode 402, defining at least one second corner 410. For this particular embodiment, the first and second active areas 404 and 406 are positioned at an angle substantially perpendicular with respect to the first and second sides 413 and 414 of the gate electrode 402. In this case, a carrier channel 412 may comprise a plurality of segments connecting from the first corner 408 to the second corner 410.

By way of example, the first and second active areas 404 and 406 comprise rectangular shapes of differing surface areas having adjacent sides 'g' and 'h' and where the adjacent sides 'g' and 'h' connect to form angles at approximately 90 degrees. The rectangular shaped active areas 404 and 406 are further positioned at an angle perpendicular with respect to the first and second sides 413 and 414 of the gate electrode 402 as indicated by the angle denoted α. Due to the differing surface areas of the first and second active areas 404 and 406, the first corner 408 is positioned offset from orthogonal with respect to the second corner 410 relative to the gate electrode length 'D'. The carrier channel 412 having a length 'L' allows a carrier current to flow from the first corner 408 to the second corner 410. In one embodiment, the carrier channel 412 comprises a plurality of orthogonal linear segments. More particularly, the carrier channel 412 comprises three linear segments, allowing the carrier current to flow in a step-like direction. The increased length of the carrier channel 412 eliminates short channel effects without affecting the threshold voltage of a device and while maintaining or reducing small device dimensions.

Figure 5:
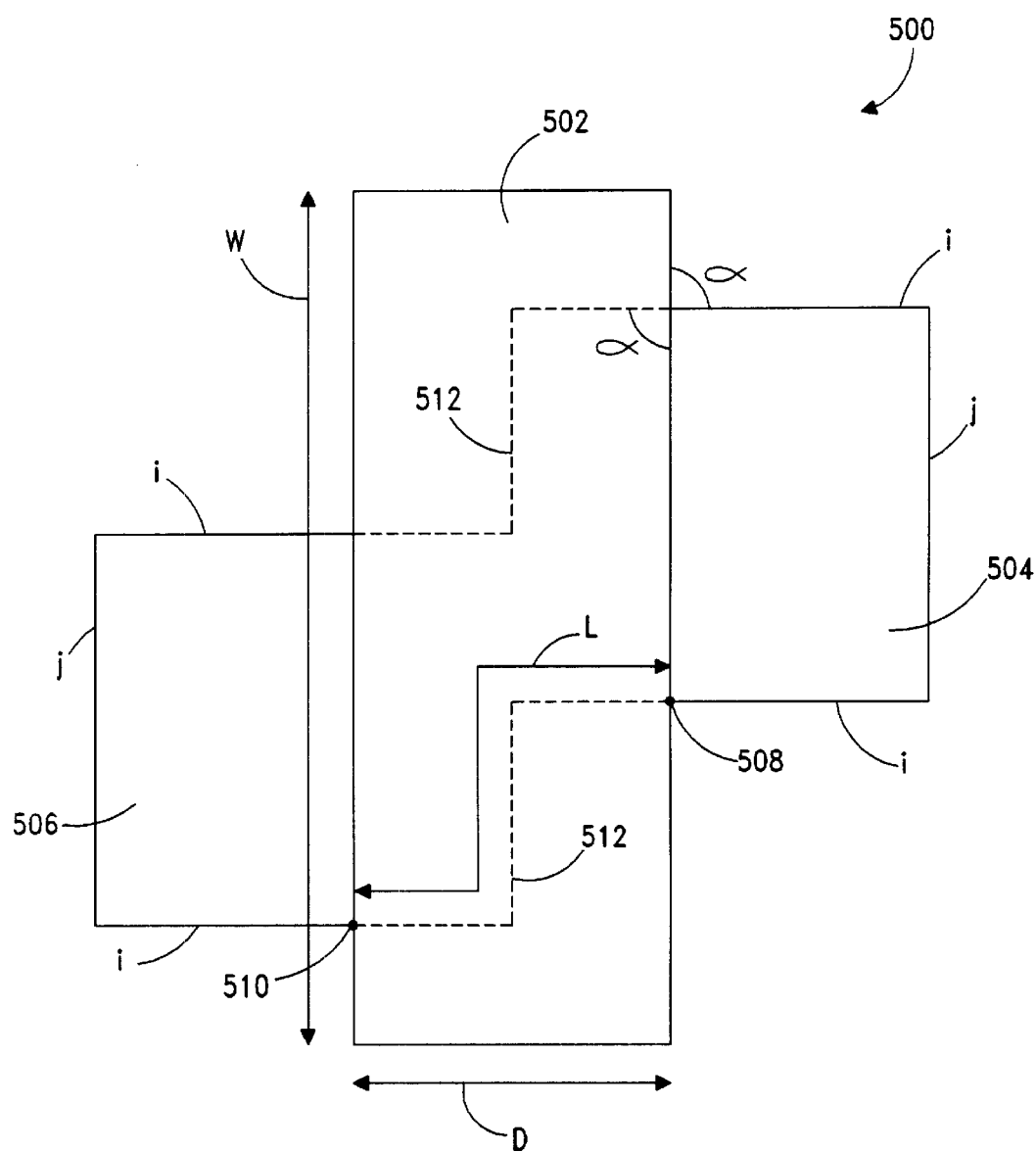

FIG. 5 is a top-down view of a semiconductor device 500 illustrating an exemplary embodiment of the present invention. The semiconductor device 500 includes a gate electrode 502 and two (first and second) active areas 504 and 506. The dimensions of the gate electrode 502 include a first side 513 substantially parallel to a second side 514, each having a width labeled as 'W' and separated by a gate electrode length 'D'. The first active area 504 lies within the substrate and adjacent to the first side 513 of the gate electrode 502, defining at least one first corner 508. Accordingly, the second active area 506 lies within the substrate and adjacent to the second side 514 of the gate electrode 502, defining at least one second corner 510. Further, the first corner 508 is positioned offset from orthogonal with respect to the second corner 510 relative to the gate electrode length D.

By way of example, the first and second active areas 504 and 506 comprise rectangular shapes of equivalent surface areas having adjacent sides 'i' and 'j' and where the adjacent sides 'i' and 'j' connect to form angles at approximately 90 degrees. The rectangular shaped active areas 504 and 506 are positioned at an angle perpendicular with respect to the first and second sides 513 and 514 of the gate electrode 502 as indicated by the angle denoted a. The first active area 504 is placed offset with respect to the second active areas 506 so that the first corner 508 is positioned offset from orthogonal with respect to the second corner 510 relative to the gate electrode length 'D'. A carrier channel 512 having a length 'L' allows a carrier current to flow from the first corner 508 to the second corner 510. In one embodiment, the carrier channel 512 comprises a plurality of orthogonal linear segments. More particularly, the carrier channel 512 comprises three linear segments, allowing the carrier current to flow in a step-like direction. The increased length of the carrier channel 512 eliminates short channel effects without affecting the threshold voltage of a device and while maintaining or reducing small device dimensions.

The present invention has been described in one or more embodiments that are to be illustrative and not restrictive. Other alternatives, variations, and modifications can be made within the scope of the invention, as it will be apparent to those skilled in the art. As an example, the active areas may comprise a variety of shapes aside from the geometrical shapes described in the previous embodiments, and the carrier channel lengths described as having one or three segments may also include two or a plurality of segments. The channel lengths described in the exemplary embodiments have also been linear. In another embodiment, the channel lengths may be curvilinear. Further, the invention has been described in embodiments of semiconductor devices. However, the invention herein is applicable in embodiments of integrated circuits comprising one or more of the semiconductor devices having a channel length longer than the gate electrode length. The scope of the invention should, therefore, be determined not with reference to the above descriptions, but instead to the appended claims.

We claim:

1. A semiconductor device, comprising:

a gate electrode having a first side and a second side separated by a gate electrode length;
a first active area adjacent to the first side of the gate electrode defining a first corner;
a second active area adjacent to the second side of the gate electrode defining a second corner; and
the first and second corners each define ending points of a carrier channel having a carrier channel length that is longer than the gate electrode length, wherein the carrier channel comprises:
two or more segments connecting from the first corner to the second corner.

2. The semiconductor device of claim 1, wherein:

the first corner is positioned offset from orthogonal with respect to the second corner relative to the gate electrode length.

3. The semiconductor device of claim 2, wherein:

the first and second active areas each comprise geometrical shapes having sides that create angles offset from perpendicular with respect to the first and second sides of the gate electrode.

4. The semiconductor device of claim 1, wherein:

the first and second active areas each comprise parallelogram shapes so that the carrier channel having two or more segments is placed at a diagonal with respect to said gate electrode length.

5. The semiconductor device of claim 1, wherein:

the first and second active areas each comprise trapezoid shapes so that the carrier channel having a linear segment is placed at a diagonal with respect to said gate electrode length.

6. The semiconductor device of claim 1, wherein:

the first and second active areas each comprise rectangular shapes having sides that create angles substantially perpendicular with respect to the first and second sides of the gate electrode.

7. The semiconductor device of claim 6, wherein:

the first active area is placed offset with respect to the second active area.

8. The semiconductor device of claim 6, wherein:

the first active area is larger in size than the second active area.

9. An integrated circuit having a semiconductor device, comprising:

a gate electrode having a first side and a second side separated by a gate electrode length;
a first active area adjacent to the first side of the gate electrode defining a first corner;
a second active area adjacent to the second side of the gate electrode defining a second corner; and
the first and second corners each define ending points of a carrier channel having a carrier channel length that is longer than the gate electrode length, wherein the carrier channel comprises:
two or more segments.

10. The integrated circuit of claim 9, wherein:

the first corner is positioned offset from orthogonal with respect to the second corner relative to the gate electrode length.

11. The integrated circuit of claim 10, wherein:

the first and second active areas each comprise geometrical shapes having sides that create angles offset from perpendicular with respect to the first and second sides of the gate electrode.

* * * * *